(12) United States Patent
Nguyen et al.

(10) Patent No.: US 11,869,595 B2
(45) Date of Patent: Jan. 9, 2024

(54) MEMORY DEVICE PROGRAMMING TECHNIQUE USING FEWER LATCHES

(71) Applicant: Micron Technology, Inc., Boise, ID (US)

(72) Inventors: Dung V. Nguyen, San Jose, CA (US); Phong Sy Nguyen, Livermore, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/085,228

(22) Filed: Dec. 20, 2022

(65) Prior Publication Data

US 2023/0121705 A1 Apr. 20, 2023

Related U.S. Application Data

(63) Continuation of application No. 17/216,015, filed on Mar. 29, 2021, now Pat. No. 11,568,937.

(51) Int. Cl.
*G11C 16/10* (2006.01)
*G11C 16/26* (2006.01)
*G11C 7/10* (2006.01)
*G11C 16/30* (2006.01)

(52) U.S. Cl.
CPC ............ *G11C 16/10* (2013.01); *G11C 7/1057* (2013.01); *G11C 7/1084* (2013.01); *G11C 16/26* (2013.01); *G11C 16/30* (2013.01)

(58) Field of Classification Search
CPC ...... G11C 16/10; G11C 7/1057; G11C 7/1084; G11C 16/26; G11C 16/30; G11C 16/0483; G11C 11/5628; G11C 2211/5622; G11C 16/08; G11C 13/0007; G11C 16/24
See application file for complete search history.

(56) References Cited

U.S. PATENT DOCUMENTS

| | | | |
|---|---|---|---|
| 10,109,361 B1 | 10/2018 | Khakifirooz et al. | |
| 11,189,326 B1 | 11/2021 | Guo | |
| 2009/0300269 A1* | 12/2009 | Radke ................. | G06F 12/0246 711/E12.008 |
| 2021/0335431 A1 | 10/2021 | Choi et al. | |
| 2022/0310164 A1 | 9/2022 | Nguyen et al. | |

* cited by examiner

*Primary Examiner* — Xiaochun L Chen
(74) *Attorney, Agent, or Firm* — Schwegman Lundberg & Woessner, P.A.

(57) ABSTRACT

A command to program data to a memory device is received. Target charge levels of a set of memory cells in the memory device for a first programming step are determined based on the data. A first set of indicators are provided to the memory device. The first set of indicators indicate the target charge levels for the first programming step. Target charge levels of the set of memory cells for a second programming step are determined based on the data. A second set of indicators are provided to the memory device. The second set of indicators indicate the target charge levels for the second programming step.

20 Claims, 12 Drawing Sheets

MEMORY DEVICE PROGRAMMING TECHNIQUE USING FEWER LATCHES

PRIORITY APPLICATION

This application is a continuation of U.S. application Ser. No. 17/216,015, filed Mar. 29, 2021, which is incorporated herein by reference in its entirety.

TECHNICAL FIELD

Embodiments of the disclosure relate generally to memory sub-systems and, more specifically, to a programming data to memory devices using indicators of memory cell charge levels.

BACKGROUND

A memory sub-system can include one or more memory devices that store data. The memory components can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
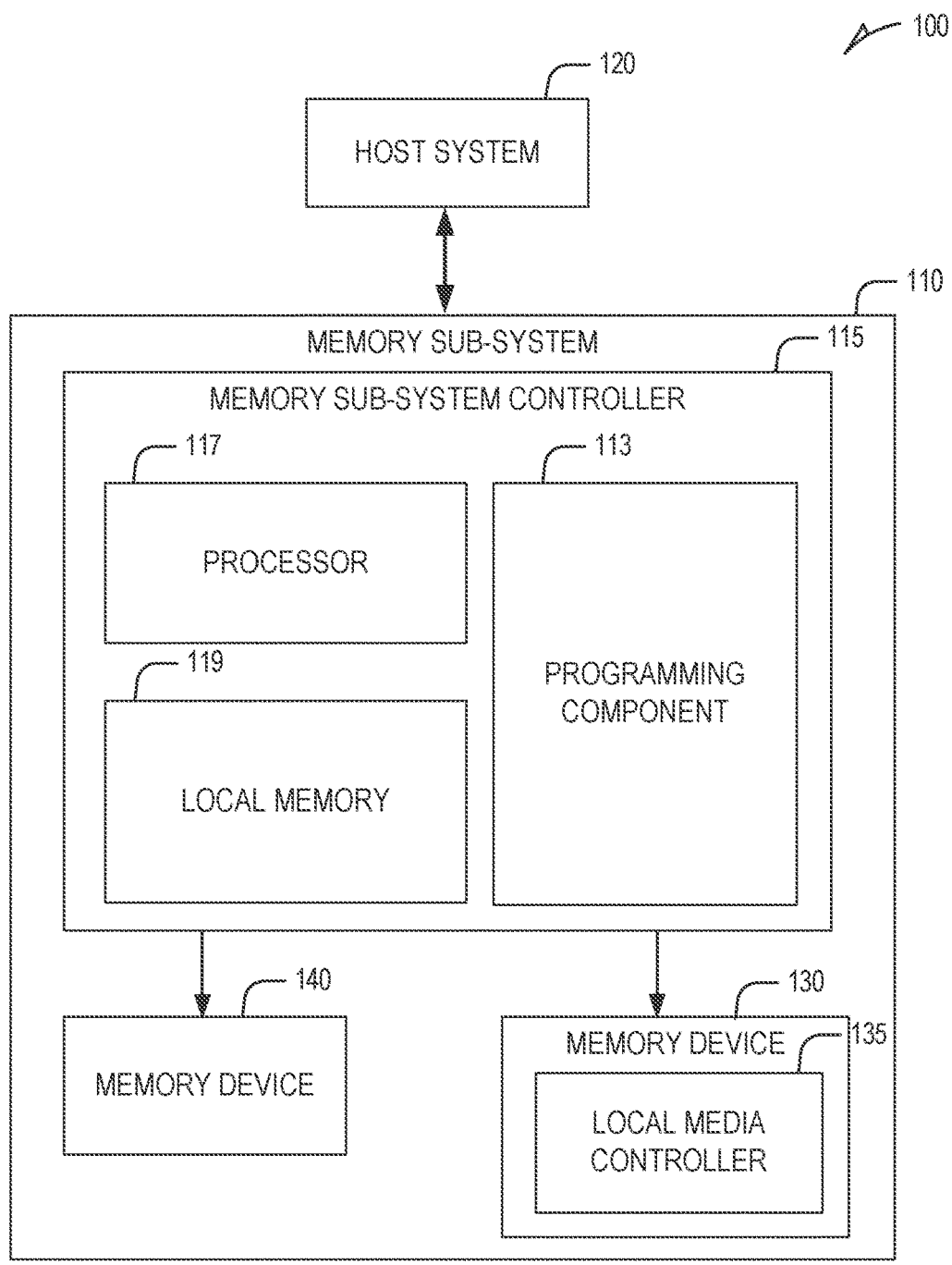
FIG. 1 is a block diagram illustrating an example computing environment that includes a memory sub-system, in accordance with some embodiments of the present disclosure.

Aspects of the present disclosure are directed to a programming a memory device in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system.

A memory device can be a non-volatile memory device. One example of a non-volatile memory device is a negative-and (NAND) memory device. Other examples of non-volatile memory devices are described below in conjunction with FIG. 1. Some memory devices, such as NAND memory devices, include an array of memory cells (e.g., flash cells) to store data. Each cell includes a transistor, and within each cell, data is stored as the threshold voltage of the transistor. More specifically, the range of threshold voltages of a transistor can be divided into multiple regions with each region corresponding to a charge level that decodes into a data value. Memory cells in these devices can be grouped as pages that can refer to a logical unit of the memory device used to store data. For example, memory cells in NAND memory devices are connected horizontally at their control gates to a word line to form a page. With some types of memory devices (e.g., NAND), pages are grouped to form blocks (also referred to herein as "memory blocks").

One type of memory cell, for example, single level cells (SLC), can store one bit per cell. Other types of memory cells, such as multi-level cells (MLCs), triple level cells (TLCs), quad-level cells (QLCs), and penta-level cells (PLCs) can store multiple bits per cell. A memory device can include one or more arrays of SLCs, MLCs, TLCs, QLCs, or any combination of such. In some instances, a memory device can include any one or more of a SLC portion, and an MLC portion, a TLC portion, a QLC portion, or a PLC portion of memory cells.

A peripheral circuit is used to read and write data from a memory cell. For example, a complementary metal—oxide—semiconductor (CMOS) circuit or "CMOS under array" circuit may be used to read and write data from a memory cell. This peripheral circuit includes one or more page buffers, often implemented by one or more latch circuits (also referred to simply as "latches"). A page buffer serves as an intermediate storage component to temporarily store data read from memory cells so that it can be transferred out of the memory device by the memory sub-system controller.

Conventionally, the number of page buffers included in the peripheral circuit depends on number of levels of the memory cells. That is, the number of page buffers used for reading from and writing to memory cells is conventionally based on the number of bits capable of being stored by the memory cells. For example, as noted above, QLCs can each store four bits and thus four page buffers are typically used to read and write data to QLC pages. TLCs, on the other hand, can each store only three bits and thus three page buffers are used to read and write data to TLC pages. However, each page buffer increases the on-chip area occupied by the peripheral circuit, which also increases manufacturing costs for the memory device. Thus, although QLCs can store one extra bit per cell than TLCs, QLCs conventionally make use of more on-chip area to support additional page buffers. Generally, the greater the number of bits capable of being stored by cells, the greater the on-chip area consumed by the portion of the cells because of the increased number of buffers needed for additional bits.

Aspects of the present disclosure relate to a memory sub-system that programs data to a memory device with cells that have multiple levels (e.g., MLCs, TLCs, QLCs, and PLCs) using fewer page buffers than the conventional methodologies discussed above. That is, the memory sub-system employs a programming technique that allows data to be programmed to pages of a memory device using fewer page buffers than a number of bits that the cells are capable of storing. For example, the memory sub-system can program data to QLC pages using fewer than four buffers per cell. Rather than providing the program data to be written to the memory device, the memory sub-system provides the memory device with a set of charge level indicators that indicate a target charge levels for memory cells in at each programming step.

The memory sub-system programs data to one or more pages in a memory device in multiple programming steps. For each programming step, a programming component of a memory sub-system controller determines target memory cell charge levels for the programming step, and the programming component sends indicators of the charge levels to the memory device. Upon receiving the indicators, the memory device performs the programming step by moving the charge levels of memory cells to the target charge levels corresponding to the indicators provided by the programming component. The programming components waits for the programming step to be successfully completed before determining charge levels for a subsequent programming step and sending corresponding indicators to the memory device for the subsequent programming step. The process continues until the memory cells reach a charge level corresponding to the data each cell is intended to store.

As noted above, the data programming technique employed by the memory sub-system described herein provides the advantage of being able to program data to memory cells using fewer latches (page buffers), and thus reduces the on-chip area consumed by the circuitry used for reading and writing data to memory cells of a memory device. In this manner, the data programming technique can allow a TLC die to support QLC programming without requiring additional latches. Further, this programming technique offers a better performance/cost ratio for mixed SLC, TLC, and QLC implementations than conventional approaches. This approach can also reduce costs for QLC and TLC dies.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include multiple host systems that are coupled to one or more memory sub-systems 110. In some embodiments, the host system 120 is coupled to different types of memory sub-system 110. FIG. 1 illustrates example host system 120 that is coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can be coupled to the memory sub-system 110 via a host interface. Examples of a host interface include, but are not limited to, a SATA interface, a PCIe interface, USB interface, Fibre Channel, Serial Attached SCSI (SAS), Small Computer System Interface (SCSI), a double data rate (DDR) memory bus, a DIMM interface (e.g., DIMM socket interface that supports Double Data Rate (DDR)), Open NAND Flash Interface (ONFI), Double Data Rate (DDR), Low Power Double Data Rate (LPDDR), or any other interface. The host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include NAND type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and 3D NAND.

Each of the memory devices 130 can include one or more arrays of memory cells. One type of memory cell, for example, single level cells (SLC), can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. For example, memory cells in NAND memory devices are connected horizontally at their control gates to a word line to form a page. With some types of memory (e.g., NAND), pages can be grouped to form blocks. Additionally, word lines within a memory device can be organized into multiple word line groups, each of which includes one or more word lines, though each word line group includes fewer word lines than are included in a block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOR flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special-purpose logic circuitry (e.g., a field programmable gate array (FPGA), an application-specific integrated circuit (ASIC), etc.), or another suitable processor.

The memory sub-system controller 115 can include a processor 117 (processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and the like. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and ECC operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 and convert responses associated with the memory devices 130 and/or the memory device 140 into information for the host system 120.

In some embodiments, the memory devices 130 include local media controller 135 that operates in conjunction with memory sub-system controller 115 to execute operations on one or more memory cells of the memory devices 130.

The memory sub-system 110 also includes a programming component 113 that is responsible for programming data to the memory devices 130 and 140 based on commands from the host system 120. The programming component 113 uses multiple programming steps to programs data to a set of memory cells in a memory device (e.g., one or more pages of a word line). The number of programming steps depends on a number of page buffers included with the memory cells being programmed. Rather than providing the program data to be written to the memory devices 130 or 140, the programming component 113 provides a set of charge level indicators that indicate a target charge levels for memory cells in at each programming step. More specifically, for each programming step, the programming component 113 determines target charge levels for each memory cell in the set of memory cells for the programming step, and the programming component 113 sends indicators of the charge levels to the memory device (also referred to herein as "charge level indicators"). The memory device receiving the charge level indicators performs the programming step by moving the charge levels of memory cells to the indicated target charge levels. The programming component 113 waits for the programming step to be successfully completed before determining charge levels for a subsequent programming step and sending corresponding indicators to the memory device 130 or 140 for the subsequent programming step. The process continues until each memory cell in the set of memory cell reaches a charge level corresponding to the data the cell is intended to store based on a predefined mapping of data vales to charge levels.

In some embodiments, the memory sub-system controller 115 includes at least a portion of the programming component 113. For example, the memory sub-system controller 115 can include a processor 117 (processing device) configured to execute instructions stored in local memory 119 for performing the operations described herein. In some embodiments, at least a portion of the programming component 113 is part of the host system 120, an application, or an operating system.

FIGS. 2A-2D is an interaction diagram illustrating example interactions between components of the memory sub-system in programming data to a memory device using indicators of memory cell charge levels, in accordance with some embodiments of the present disclosure. In the example illustrated in FIGS. 2A-2D, the memory device 130 is a NAND memory device that includes multiple memory blocks. As shown, a NAND block 200 includes an array (2D or 3D) of pages (rows) and strings (columns). Each NAND cell includes a transistor, and within each cell, data is stored as the threshold voltage of the transistor. SLC NAND, for example, can store one bit per cell. Other types of memory cells, such as MLCs, TLCs, QLCs, and PLCs can store multiple bits per cell. Strings are connected within the NAND block 200 to allow storage and retrieval of data from selected cells. NAND cells in the same column are connected in series to form a bit line (BL). All cells in a bit line are connected to a common ground on one end and a common sense amplifier on the other for reading the threshold voltage of one of the cells when decoding data. NAND cells are connected horizontally at their control gates to a word line (WL) to form a page. In MLC, TLC, QLC, and PLC NAND, a page is a set of connected cells that share the same word line and is the minimum unit to program.

As noted above, each NAND cell stores data in the form of the threshold voltage ($V_{th}$) of the transistor. The range of threshold voltages of a of a memory cell is divided into number of regions based on the number of bits stored by the cell and each region corresponds to a value that can be represented by the cell. More specifically, each region corresponds to a charge level and each charge level decodes into a multi-bit value. For example, a TLC NAND flash cell can at one of eight charge levels—ER (erased), L0, L1, L2, L3, L4, L5, or L6. Each charge level decodes into a 3-bit value that is stored in the flash cell (e.g., 111, 110, 100, 000, 010, 011, 001, and 101).

During each programming step, data is programmed into a block of the memory device 130 using a programming sequence that includes multiple passes in which programming pulses are applied to cells in the block. Over the multiple passes, the programming pulses configure the threshold voltages of the cells in each page according to a target charge level based on the value the cells are intended to represent. As the programming sequence progresses, the voltage level of the programming pulses increase until the threshold voltages of the cells reach the target charge level.

Figure 2A:
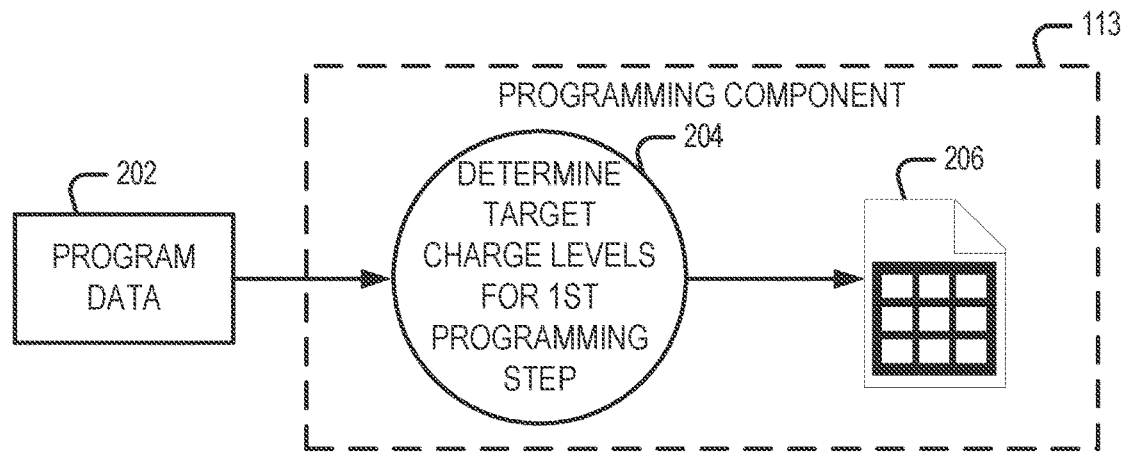
FIGS. 2A-2D are interaction diagrams illustrating example interactions between components of the memory sub-system in programming data to a memory device using indicators of memory cell charge levels, in accordance with some embodiments of the present disclosure.
Figure 2A:
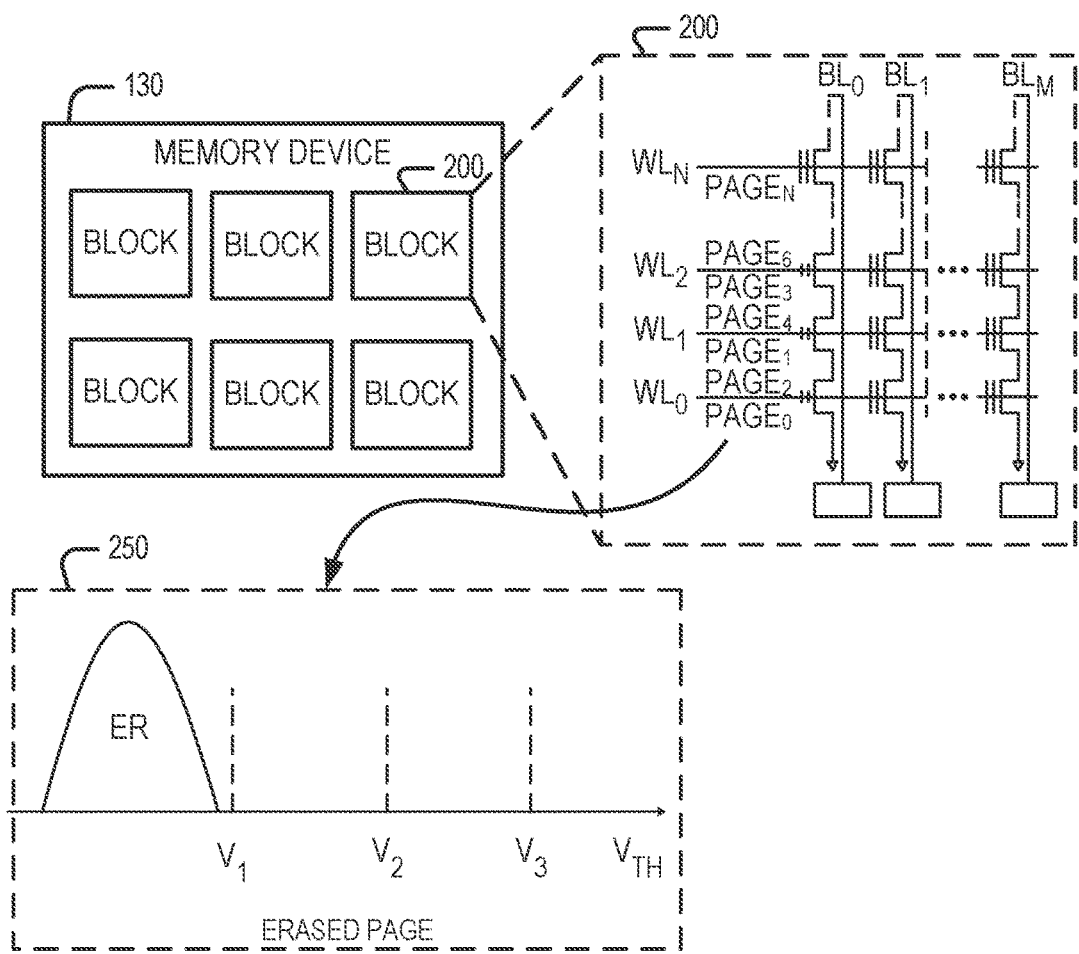

FIGS. 2A-2D also illustrate a graph 250 of charge levels of an example page within the block 200 of the memory device 130 during the process of programming data to the example page. With reference to FIG. 2A, the example page is initially an erased page (as denoted by "ER" in the graph 250). A command to program data to the memory device 130 is received by the memory sub-system controller 115 and program data 202 specified by the command is provided to the programming component 113. At 204, the programming component 113 determines target charge levels for a set of memory cells within the block 200 of the memory device 130 for a first programming step. The set of memory cells are the memory cells to which the program data 202 is to be programmed and correspond to one or more pages in the block 200. The programming component 113 determines a target charge level for each memory cell for the first programming step based on a predefined mapping 206 of charge levels to program data values. The predefined mapping 206 specifies a charge level (e.g., ER, L1, L2, L3, L4, L5, L6 or L7) for each program data value (e.g., 111, 110, 100, 000, 010, 011, 001, and 101).

Figure 2B:
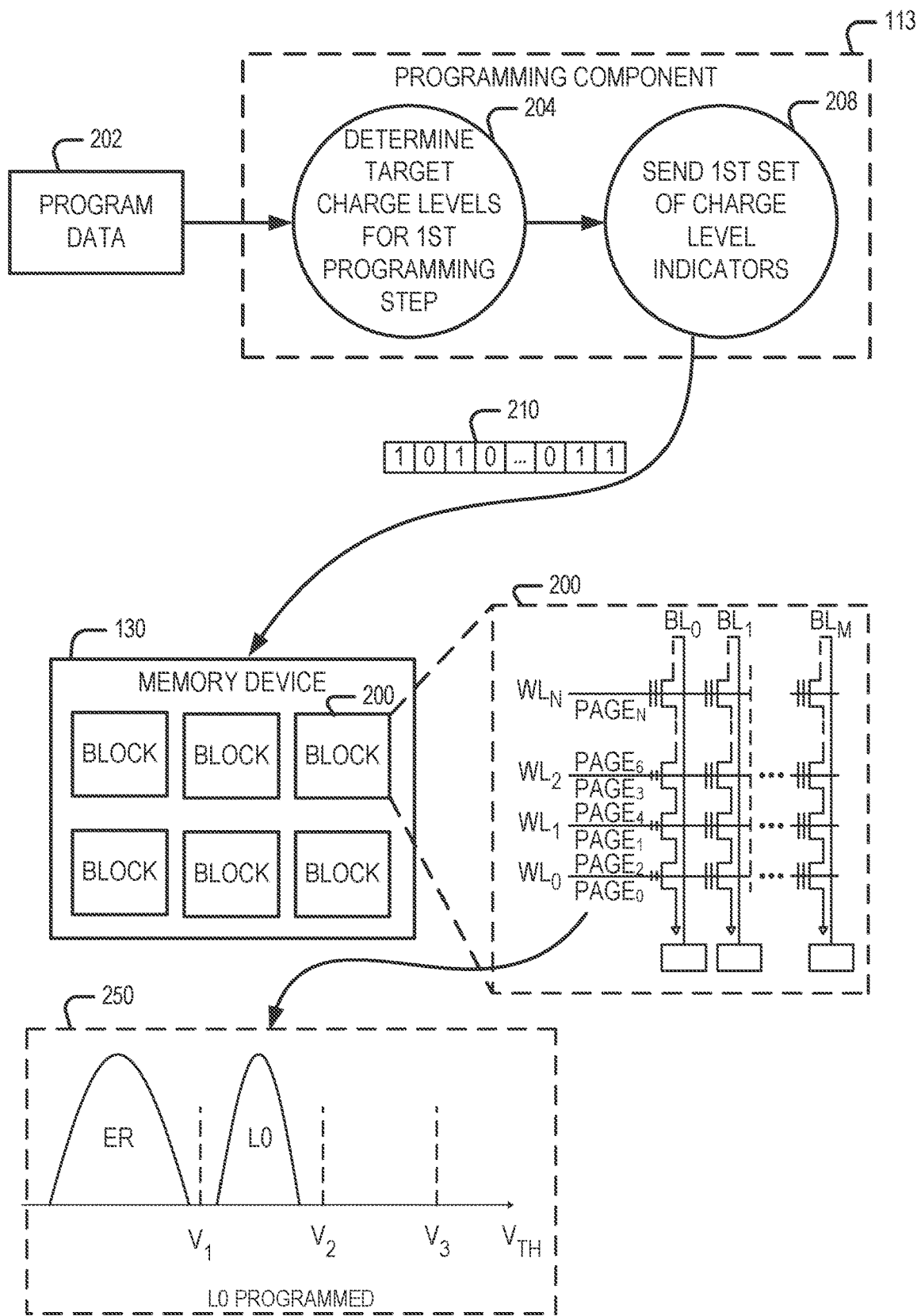

With reference to FIG. 2B, at 208, the programming component 113 sends a first set of charge level indicators 210 to the memory device 130. The first set of charge level indicators 210 indicate the target charge levels for the set of memory cells for the first programming step. Each indicator can include one or more binary values, and the number of binary values in each indicator is based on a number of page buffers per page in the memory device 130. In this example, the memory block includes QLCs and only one page buffer (e.g., including one or more latches) is used per page. The processing device can write the first set of indicators to the page buffers in the memory device. Each indicator in the first set of charge level indicators 210 indicates whether the target charge level of a cell is at least at a first level (L0). That is, each indicator includes a binary value where a '1' indicates that a target charge level of a corresponding cell is greater than or equal to L0.

In response to receiving the first set of charge level indicators 210, the memory device 130 performs the first programming step in part by moving the set of memory cells to the target charge levels indicated by the first set of charge level indicators 210. The first programming step can include multiple programming passes as described above. As shown in the graph 250, upon successful completion of the first programming step, cells within the example page indicated as having a target charge level at least at L0 are programmed.

Figure 2C:
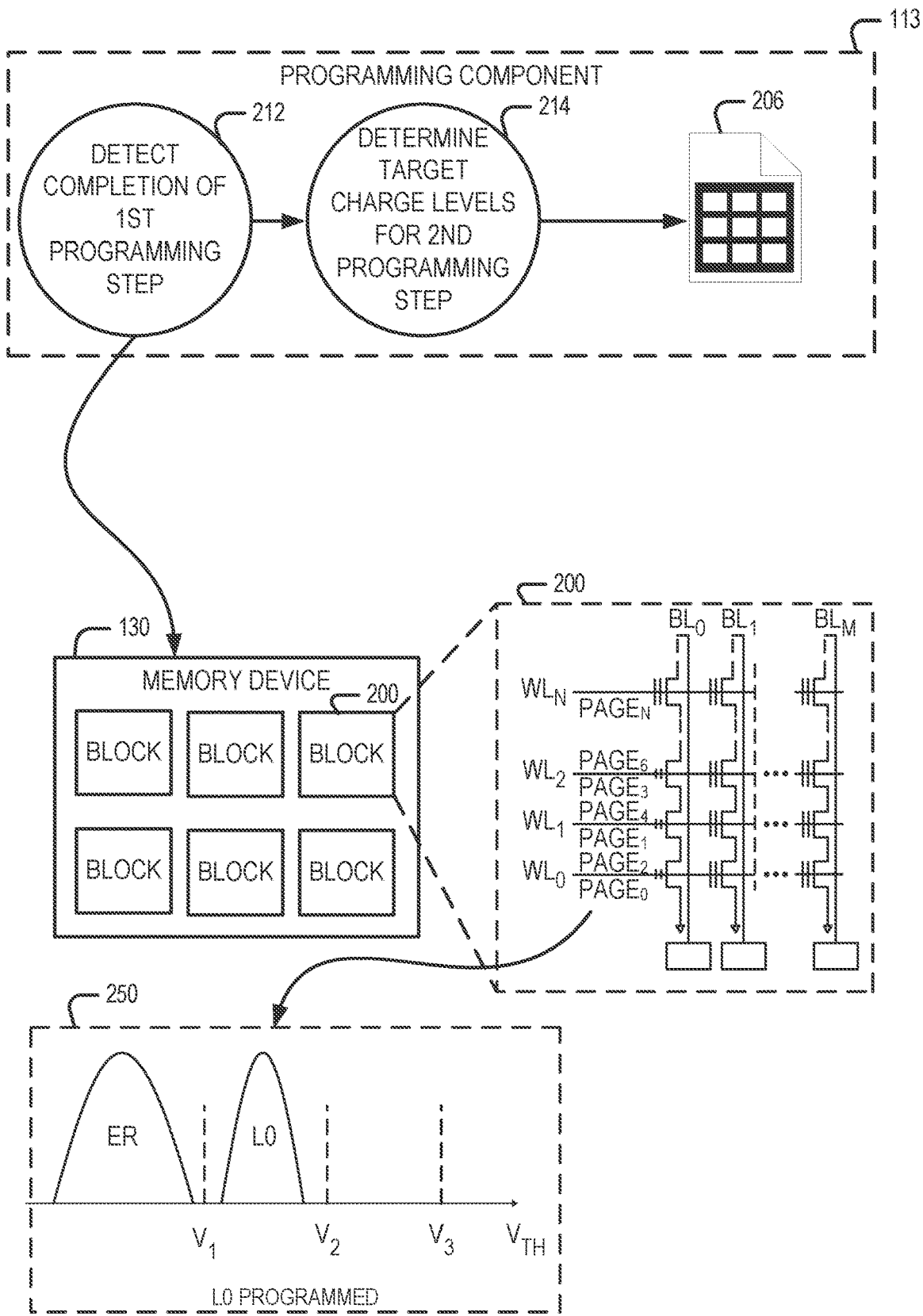

With reference to FIG. 2C, based on detecting completion of the first programming step, at 212, the programming component 113 determines target charge levels for the set of memory cells for a second programming step, at 214. The programming component 113 determines the target charge levels for the second programming step based on the program data 202 and the predefined mapping 206.

Figure 2D:
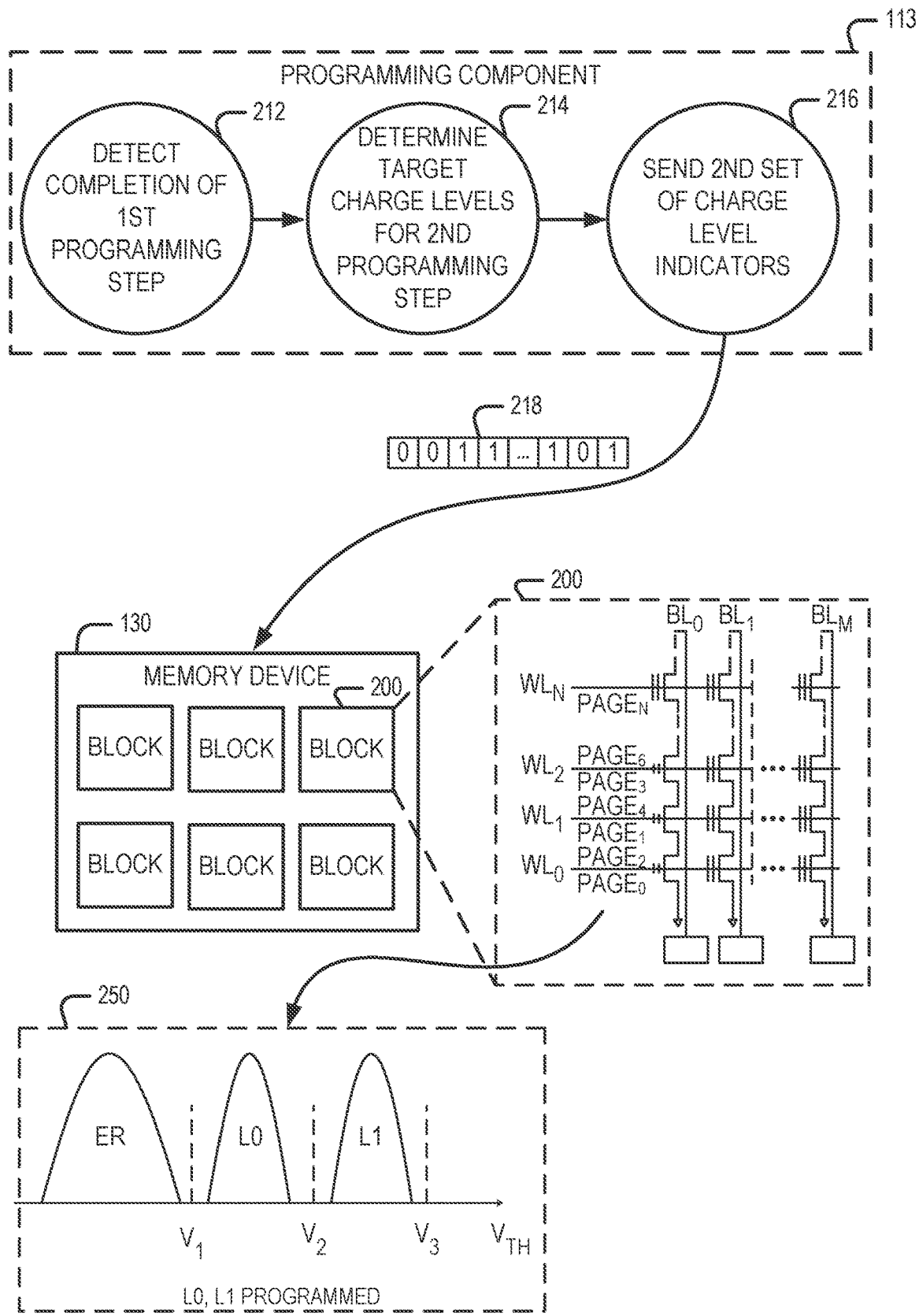

With reference to FIG. 2D, at 216, the programming component 113 sends a second set of charge level indicators 218 to the memory device 130. The second set of charge level indicators 218 indicate the target charge levels for the set of memory cells for the second programming step. The processing device can write the second set of indicators to the page buffers in the memory device. In this example, each indicator in the second set of charge level indicators 210 indicates whether the target charge level of a cell is at least at a second level (L1). That is, each indicator includes a binary value where a '1' indicates that a target charge level of a corresponding cell is greater than or equal to L1.

In response to receiving the second set of charge level indicators 218, the memory device 130 performs the second programming step in part by moving the set of memory cells to the target charge levels indicated by the second set of charge level indicators 218. As with the first programming step and any subsequent programming step, the second programming step can include multiple programming passes as described above. As shown in the graph 250, upon successful completion of the second programming step, cells within the example page indicated as having a target charge level at least at L1 are programmed and cells indicate as not being at least at L1 are maintained at previous levels (ER or L0).

In this example of a TLC block with only a single latch per TLC, a total of eight programming steps are performed and the process described above is repeated until the eight programming step is completed by the memory device 130 in accordance with an eight set of charge level indicators provided by the programming component 113. It shall be appreciated that the techniques for programming data to memory devices described herein are not limited to any number of programming steps. That is, in other embodiments such as embodiments in which the memory device 130 includes MLCs, TLCs, or PLCs or a different number of latches per cell, fewer or additional programming steps can be used.

Figure 3:
FIG. 3 is a conceptual diagram illustrating a mapping between program data, charge level, and charge level indicators, in accordance with some embodiments of the present disclosure.
Figure 3:

As another example, FIG. 3 illustrates a mapping between charge level and charge level indicators for programming to QLC pages using three page buffers, in accordance with some example embodiments. As shown, 16 charge levels are used to program data to the QLCs. Given the three page buffers and 16 charge levels, three programming steps are used in this example to program data.

In the first programming step, "111" is provided for memory cells with a target charge level of equal to or greater than 7. Indicators for memory cells with a target charge level less than 6 are based on the corresponding binary value of the charge level.

In the second programming step, "000" is provided for memory cells with a target charge level less than 5 to indicate that the memory cells should be maintained at their current charge level. That is, "000" is used to indicate that a current charge level of a corresponding cell is the target charge level for the cell for the second and other programming steps. For the second programming step, "111" is used to indicate corresponding cells have a target charge level equal to or greater than 14.

In the third programming step, "000" is provided for memory cells with a target charge level less than 13 to indicate that the memory cells should be maintained at their current charge level. For the third programming step, only a single bit is used to indicate whether the target charge level is 14 or 15.

Figure 4:
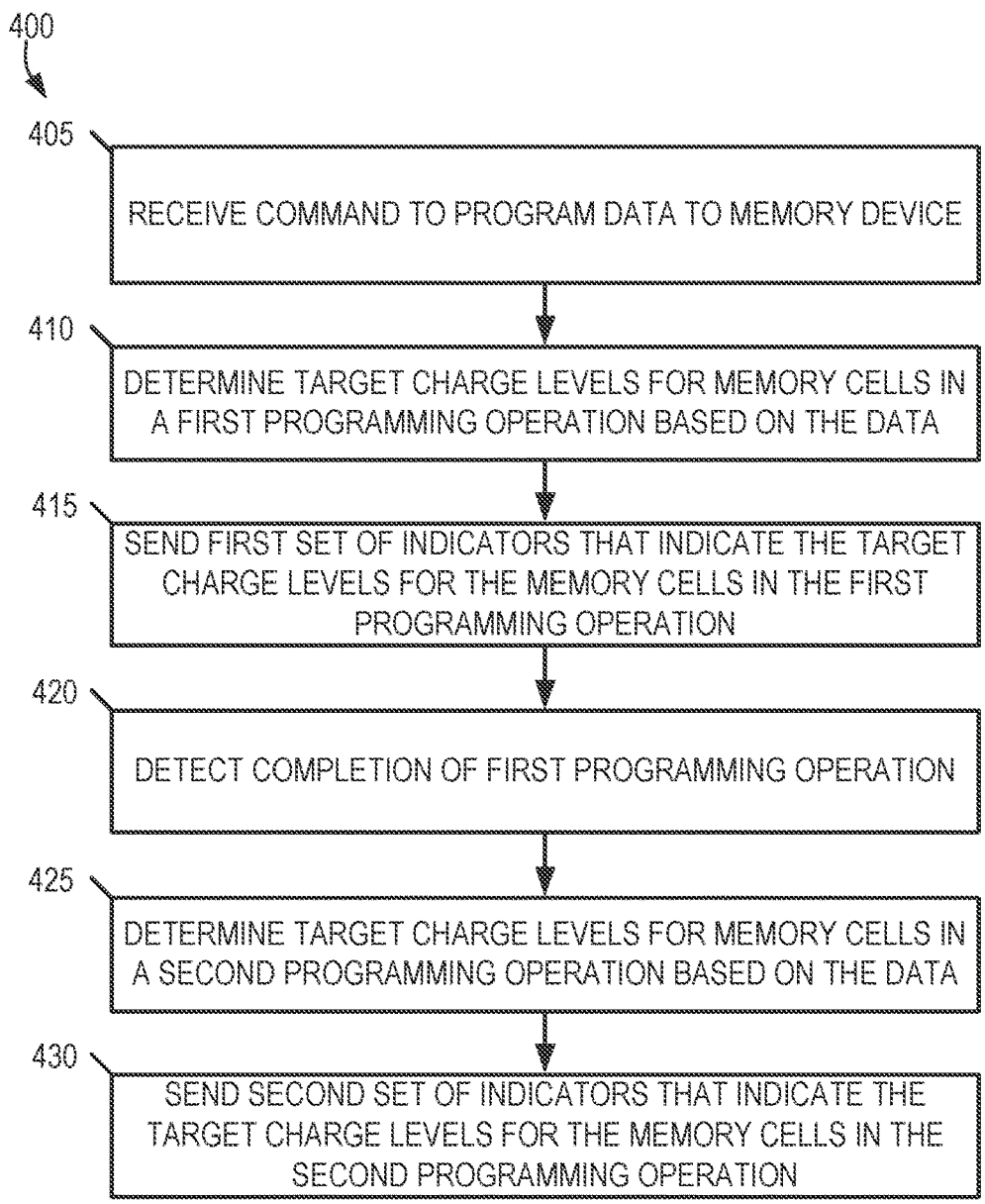
FIGS. 4-6 are flow diagrams illustrating an example method for programming data to a memory device by communicating indicators of target charge levels to the memory device, in accordance with some embodiments of the present disclosure.
Figure 5:
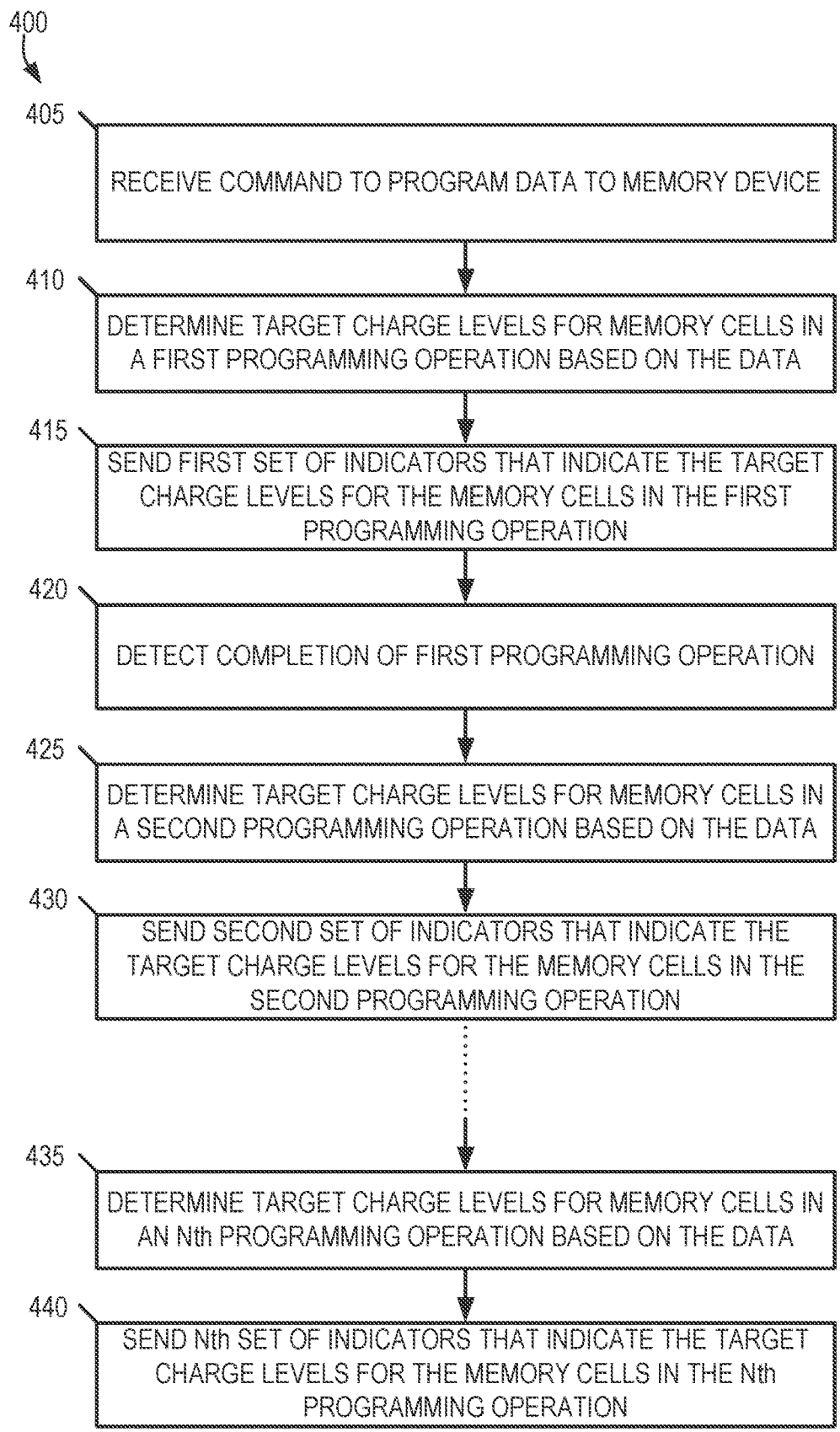
Figure 6:
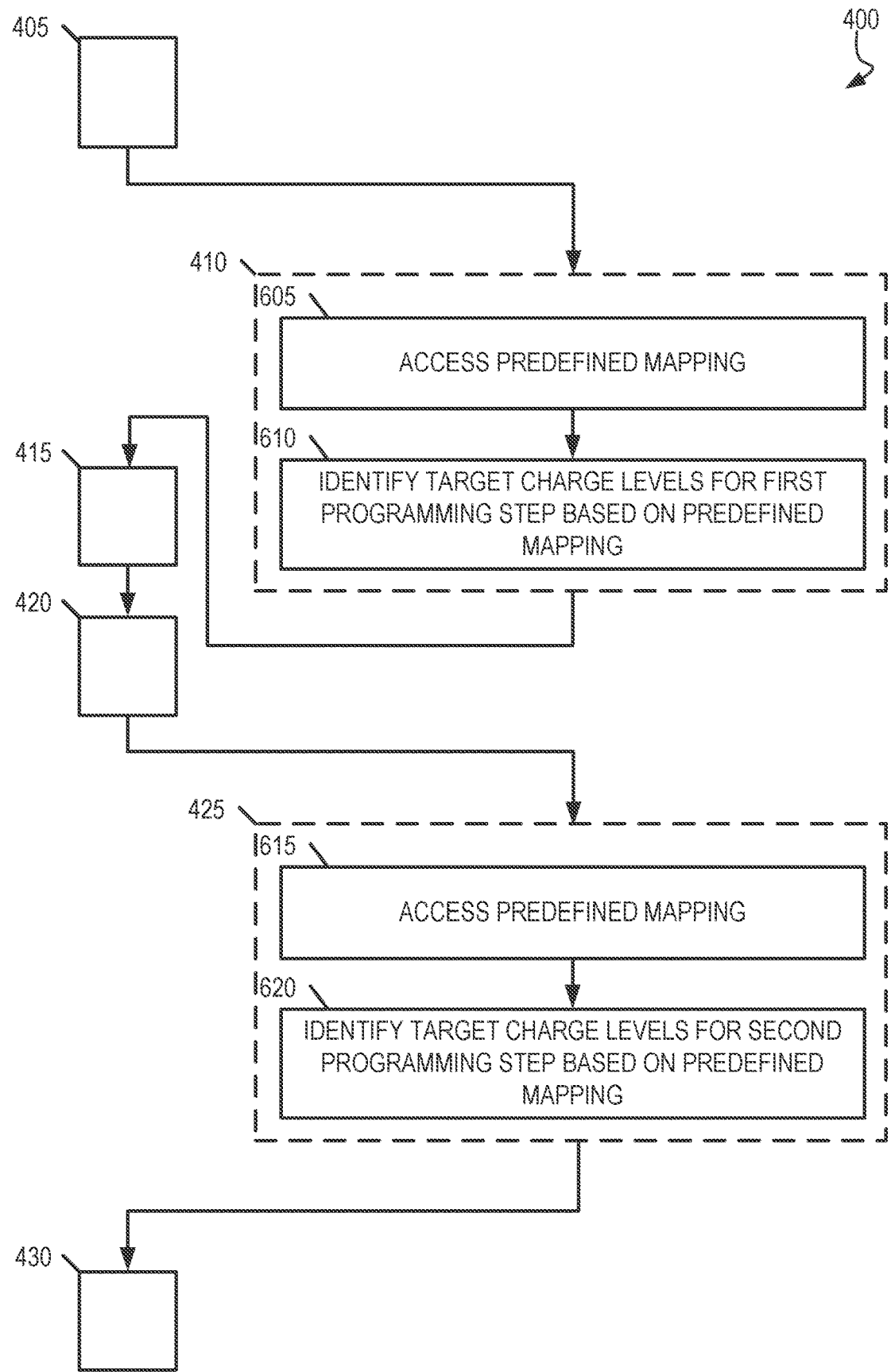

FIGS. 4-6 are flow diagrams illustrating an example method 400 for programming data to a memory device by communicating indicators of target charge levels to the memory device, in accordance with some embodiments of the present disclosure. The method 400 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 400 is performed by the programming component 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are made use of in every embodiment. Other process flows are possible.

At operation 405, the processing device receives a command to program data to a memory device (e.g., memory device 130). The command can be received from a host system (e.g., the host system 120).

The processing device determines target charge levels for a set of memory cells in the memory device for a first programming step based on the data (at operation 410). That is, the processing device determines a target charge level for each memory cell in the set of memory cells for the first programming step. For example, the processing device can determine the target charge level for a first memory cell or sub-set of memory cells is a first charge level, and the target charge level for a second memory cell or second sub-set of memory cells is at least a second charge level. The processing device can determine the charge levels based on a predefined mapping between charge level and program data. The set of memory cells may correspond to one or more pages of a wordline in the memory device.

At operation 415, the processing device sends, to the memory device, a first set of indicators that indicate the target charge levels for the set of memory cells for the first programming step. Each indicator can include one or more binary values. The number of binary values in each indicator is based on the number of page buffers per page in the memory device. The processing device can write the first set of indicators to one or page buffers in the memory device. In response to receiving the first set of indicators, the memory device performs the first programming step in part by moving the set of memory devices to the target charge levels indicated by the first set of indicators.

In response to detecting completion of the first programming step (operation 420), the processing device determines charge levels for the set of memory cells in a second programming step based on the data, at operation 425. At operation 430, the processing device sends a second set of indicators to the memory device. The second set of indicators indicate the target charge levels for the set of memory cells in the second programming step. In response to receiving the second set of indicators, the memory device performs the second programming step in part by moving one or more memory cells in the set of memory devices to the target charge levels indicated by the second set of indicators.

Consistent with some embodiments, the programming of the data to the memory device is complete upon successful completion of the second programming step. However, it shall be appreciated that the method 400 is not limited to two programming steps, and in other embodiments, additional programming steps can be used to program the data to the memory device. Accordingly, as shown in FIG. 5, the method 400 can, in some embodiments, include operations 435 and 440 to address an Nth programming step, as well as one or more intervening operations directed to providing indicators for one or more intervening programming steps.

At operation 435, the processing device determines target charge levels for the set of memory cells in an Nth programming step. The processing device sends an Nth set of indicators to the memory device, at operation 440. The Nth set of indicators indicate the target charge levels for the set of memory cells in the nth programming step.

As shown in FIG. 6, the method 400 can also include operations 605, 610, 615, and 620, in some embodiments. Consistent with these embodiments, operations 605 and 610 can be performed as part of the operation 410 where the processing device determines target charge levels for the set of memory cells for the first programming step. At operation 605, the processing device access a predefined mapping between data values and memory cell charge level. That is, for each data value a memory cell is capable of storing, which is dependent on the number of bits that can be stored by the cell, the predefined mapping specifies the corresponding charge level for the cell. For each memory cell in the set of memory cells, the processing device identifies a target charge level for the first programming step from the predefined mapping based on the value the cell is to store, at operation 610.

Consistent with these embodiments, operations 615 and 620 can be performed as part of the operation 425 where the processing device determines target charge levels for the set of memory cells for the second programming step. At operation 615, the processing device access the predefined mapping between data values and memory cell charge level. For each memory cell in the set of memory cells, the processing device identifies the target charge level for the second programming step from the predefined mapping based on the value the cell is to store, at operation 620.

Figure 7:
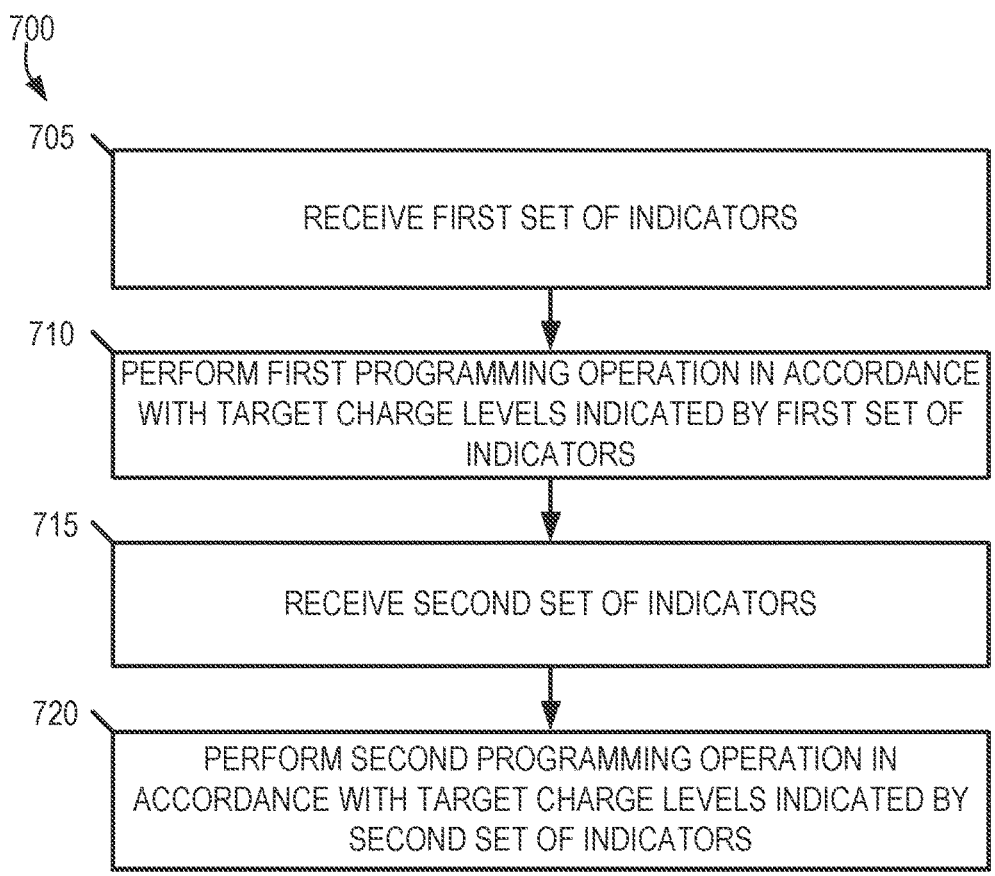
FIGS. 7 and 8 are flow diagrams illustrating an example method for programming data to a memory device based on indicators of target charge levels received from a memory sub-system controller, consistent with some embodiments.
Figure 8:
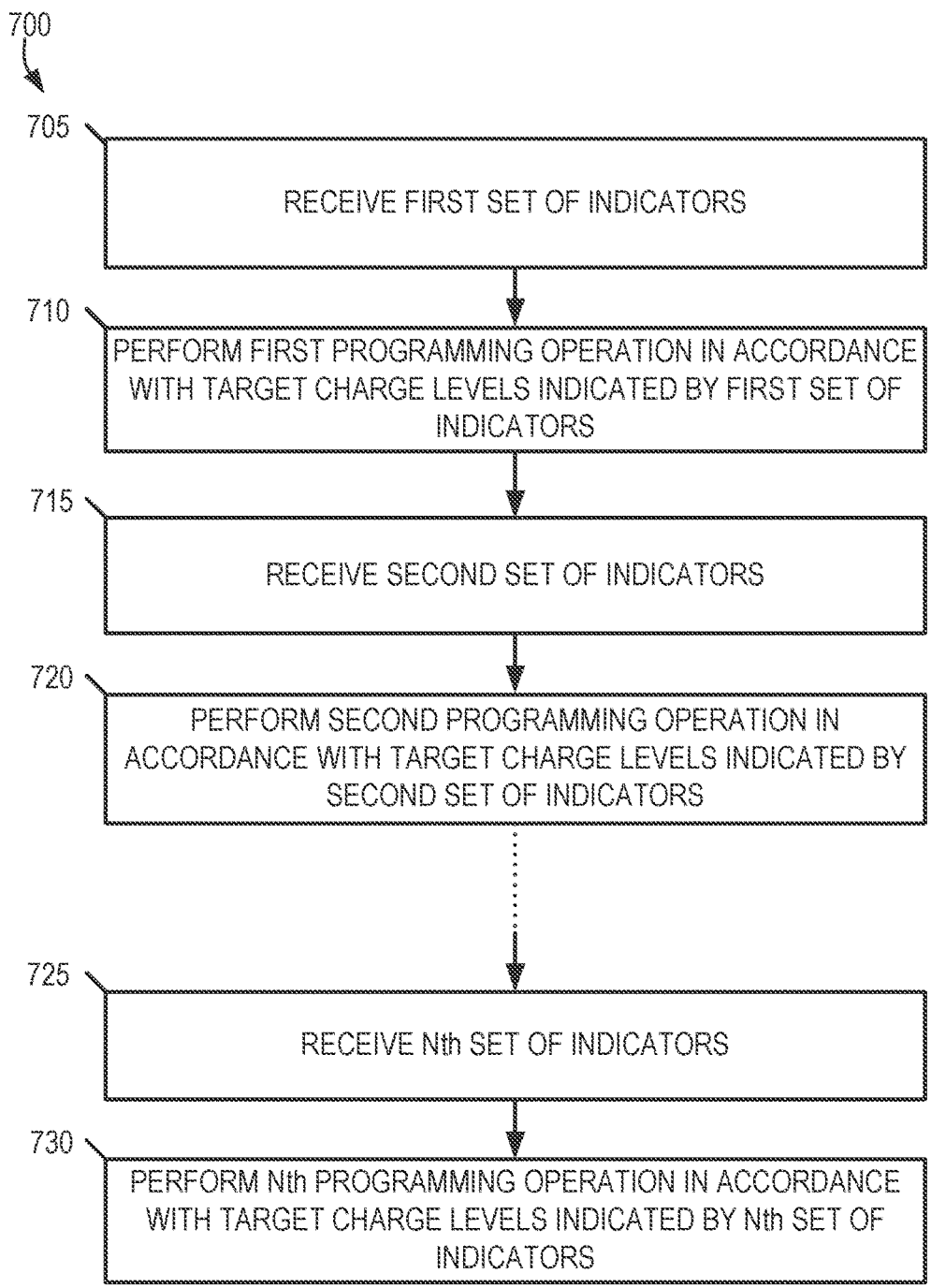

FIGS. 7 and 8 is a flow diagram illustrating an example method 700 for programming data to a memory device based on indicators of target charge levels received from a memory sub-system controller (e.g., the memory sub-system controller 115), consistent with some embodiments. The method 700 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 700 is performed by the local media controller 135 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are made use of in every embodiment. Other process flows are possible.

At operation 705, the processing device receives, from the memory sub-system controller, a first set of indicators that indicate the target charge levels for a set of memory cells for a first programming step. The first set of indicators can be provided by the memory sub-system controller in response to receiving a command to program data to the memory device from a host system. The memory sub-system controller writes the first set of indicators to one or more page buffers connected to the set of memory cells.

In response to receiving the first set of indicators, the processing device, at operation 710, performs the first programming step in accordance with the first set of indicators. That is, the processing device causes the set of memory cells to move to the target charge levels indicated by the first set of indicators. The processing device cause the set of memory cells to move to the target charge level using a programming sequence that includes multiple passes in which programming pulses are applied to cells in the block. Over the multiple passes, the programming pulses change the threshold voltages of the cells in each page according to a target charge level. As the programming sequence progresses, the voltage level of the programming pulses increases until the threshold voltages of the cells reach the target charge levels indicated by the first set of indicators.

At operation 715, the processing device receives, from the memory sub-system controller, a second set of indicators that indicate target charge levels for the set of memory cells for a second programming step. In response to receiving the second set of indicators, the processing device, at operation 720, performs the second programming step in accordance with the second set of indicators. That is, the processing device causes one or more cells in the set of memory cells to move to the target charge levels indicated by the second set of indicators. In some instances, one or more cells may be at the target charge level based on the first programming step. In these instances, the processing devices maintains the one or more cells at a current charge level during the second programming step while moving one or more cells to a higher target charge level indicated by the second set of indicators associated with the second programming step.

Consistent with some embodiments, the programming of the data to the memory device is complete upon successful completion of the second programming step. However, it shall be appreciated that the method 700 is not limited to two programming steps, and in other embodiments, additional programming steps can be used to program the data to the memory device. Accordingly, as shown in FIG. 8, the method 700 can, in some embodiments, include operations 725 and 730, which are directed to an Nth programming step, as well as one or more intervening operations directed to providing indicators for one or more intervening programming steps.

At operation 725, the processing device receives, from the memory sub-system controller, an Nth set of indicators that indicate target charge levels for the set of memory cells for a Nth programming step. In response to receiving the Nth set of indicators, the processing device, at operation 730, performs the Nth programming step in accordance with the Nth set of indicators. As with the second programming step, one or more cells may be at the corresponding target charge level indicated by the Nth set of indicators, and in these instances, the processing device maintains the one or more cells at their current charge level while moving one or more cells to a higher target charge level indicated by the Nth set of indicators.

Described implementations of the subject matter can include one or more features, alone or in combination as illustrated below by way of example.

Example 1 is a system including: a memory device; and a processing device coupled to the memory device, the processing device configured to perform operations comprising: receiving a command to program data to the memory device; determining, based on the data, target charge levels of a set of memory cells in the memory device for a first programming step; sending, to the memory device, a first set of indicators that indicate the target charge levels of the set of memory cells for the first programming step; determining, based on the data, target charge levels of the set of memory cells in the memory device for a second programming step; and sending, to the memory device, a second set of indicators that indicate the target charge levels for the set of memory cells in the memory device for a second programming step.

Example 2 includes the system of Example 1, wherein determining the target charge levels for the set of the memory cells comprises identifying the target charge levels for the set of the memory cells from a predefined mapping between data values and charge levels.

Example 3 includes the system of any one or more of Examples 1 or 2, wherein the operations further comprise: detecting completion of the first programming step at the memory device, the sending of the second set of indicators is in response to detecting completion of the first programming step at the memory device.

Example 4 includes the system of any one or more of Examples 1-3, wherein the operations further comprise: determining, based on the data, target charge levels for set of memory cells for a third programming step; and sending, to the memory device, a third set of indicators that indicate the target charge levels for the set of memory cells for the third programming step.

Example 5 includes the system of any one or more of Examples 1-4, wherein: an indicator in the first set of indicators indicates whether a target charge level for a first memory cell is at least at a first charge level; and an indicator in the second set of indicators indicates whether a target charge level for a second memory cell is at least at a second charge level.

Example 6 includes the system of any one or more of Examples 1-5, wherein: each indicator in the first and second set of indicators comprises one or more binary values, a number of binary values in each indicator is based on a number of page buffers per page in the memory device.

Example 7 includes the system of any one or more of Examples 1-6, wherein: the sending of the first set of indicators comprises writing the first set of indicators to one or more page buffers of the memory device; and the sending of the second set of indicators comprises writing the second set of indicators to one or more page buffers of the memory device.

Example 8 is a method comprising: receiving, by a processing device, a command to program data to a memory device; determining, by the processing device, target charge levels of a set of memory cells in the memory device for a first programming step based on the data; sending, to the memory device, a first set of indicators that indicate the target charge levels of the set of memory cells for the first programming step; detecting completion of the first programming step at the memory device, in response to detecting completion of the first programming step at the memory device, determining, by the processing device, target charge levels of the set of memory cells in the memory device for a second programming step based on the data; and sending, to the memory device, a second set of indicators that indicate the target charge levels for the set of memory cells in the memory device for a second programming step.

Example 9 includes the method of Example 8, wherein determining the target charge levels for the set of the memory cells comprises identifying the target charge levels for the set of the memory cells from a predefined mapping between data values and charge levels.

Example 10 includes the method of any one or more of Examples 8 or 9, further comprising: determining, based on the data, target charge levels for set of memory cells for a third programming step; and sending, to the memory device, a third set of indicators that indicate the target charge levels for the set of memory cells for the third programming step.

Example 11 includes the method of any one or more of Examples 8-10 wherein: an indicator in the first set of indicators indicates whether a target charge level for a first memory cell is at least at a first charge level; and an indicator in the second set of indicators indicates whether a target charge level for a second memory cell is at least at a second charge level.

Example 12 includes the method of any one or more of Examples 8-11, wherein: each indicator in the first and second set of indicators comprises one or more binary values, a number of binary values in each indicator is based on a number of page buffers per page in the memory device.

Example 13 includes the method of any one or more of Examples 8-12, wherein: the sending of the first set of indicators comprises writing the first set of indicators to one or more page buffers of the memory device; and the sending of the second set of indicators comprises writing the second set of indicators to one or more page buffers of the memory device.

Example 14 is memory device comprising: a set of memory cells; and a processing device coupled to the set of memory cells, the processing device configured to perform operations comprising: receiving, from a memory sub-system controller, a first set of indicators that indicate target charge levels of the set of memory cells for a first programming step; performing the first programming step according to the target charge levels indicated by the first set of indicators; receiving, from a memory sub-system controller, a second set of indicators that indicate target charge levels for the set of memory cells in the memory device for a second programming step; and performing the second programming step according to the target charge levels indicated by the second set of indicators.

Example 15 includes the memory device of Example 14, wherein: performing the first programming step comprises moving charge levels of the set of memory cells to the target charge levels indicated by the first set of indicators; and performing the second programming step comprises moving charge levels of the set of memory cells to the target charge levels indicated by the second set of indicators.

Example 16 includes the memory device of any one or more of Examples 14 or 15, wherein the target charge levels for the first and second programming step are based on a predefined mapping between data values and charge level.

Example 17 includes the memory device of any one or more of Examples 14-16, wherein the first and second set of indicators are determined based on data included in a command to write the data to the memory device received by the memory sub-system controller.

Example 18 includes the memory device of any one or more of Examples 14-17, wherein: an indicator in the first set of indicators indicates whether a target charge level for a first memory cell is at least at a first charge level; and an indicator in the second set of indicators indicates whether a target charge level for a second memory cell is at least at a second charge level.

Example 19 includes the memory device of any one or more of Examples 14-18, wherein: receiving, from a memory sub-system controller, a third set of indicators that indicate target charge levels for the set of memory cells in the memory device for a third programming step; and performing the third programming step according to the target charge levels indicated by the third set of indicators.

Example 20 includes the memory device of any one or more of Examples 14-19, further comprising: one or more page buffers to receive the first and second set of indicators, wherein each indicator in the first and second set of indicators comprises one or more binary values, wherein a number of binary values in each indicator is based on a number of page buffers per page in the memory device.

Figure 9:
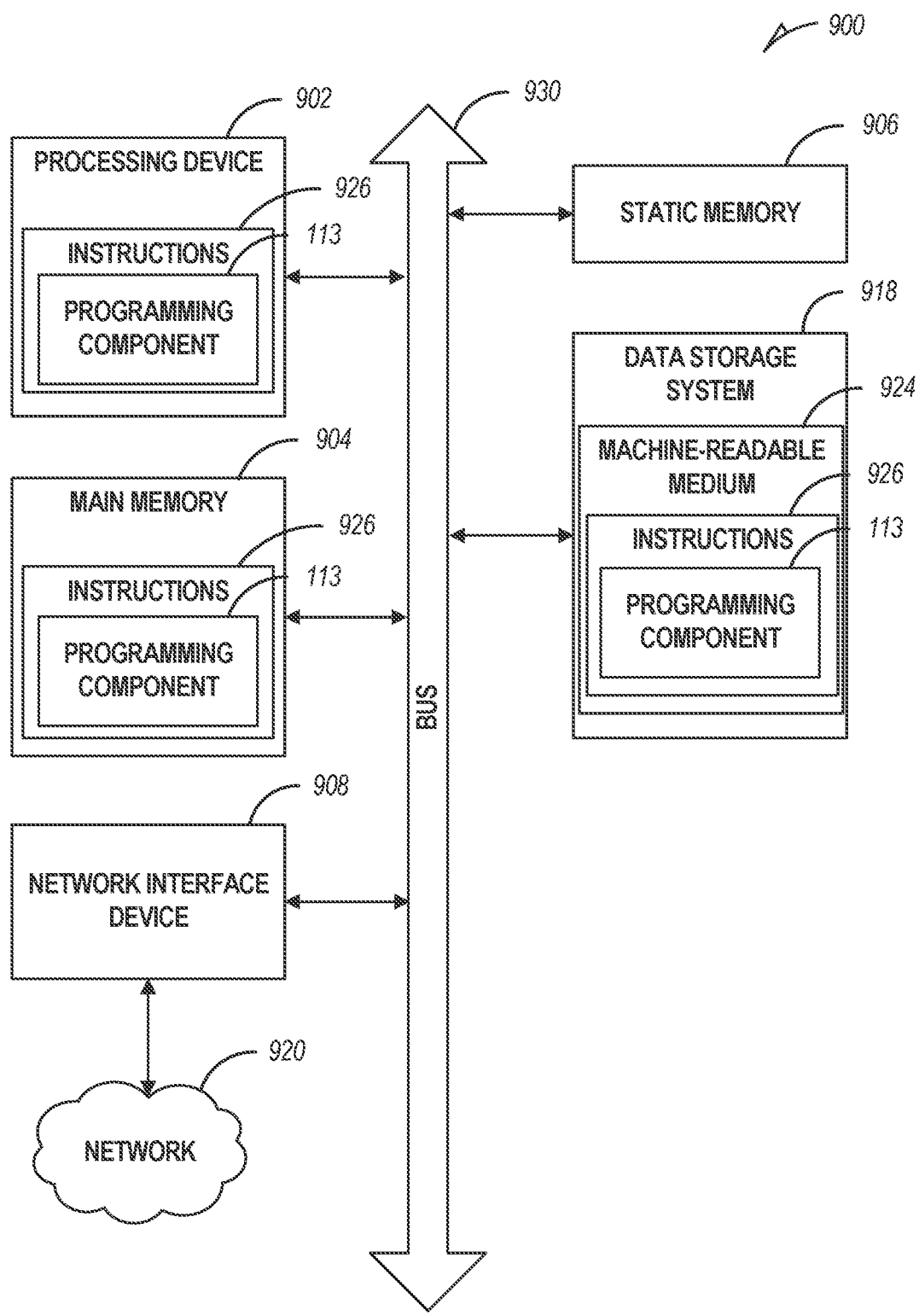
FIG. 9 is a block diagram of an example computer system in which embodiments of the present disclosure may operate.

FIG. 9 illustrates an example machine in the form of a computer system 900 within which a set of instructions can be executed for causing the machine to perform any one or more of the methodologies discussed herein. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the programming component 113 of FIG. 1). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., ROM, flash memory, DRAM such as SDRAM or RDRAM, etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device 902 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an ASIC, a FPGA, a digital signal processor (DSP), network processor, or the like. The processing device 902 is configured to execute instructions 926 for performing the operations and steps discussed herein. The computer system 900 can further include a network interface device 908 to communicate over a network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to a security component (e.g., the programming component 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, etc.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device coupled to the memory device, the processing device configured to perform operations comprising:
receiving a command to program data to the memory device;
determining, based on the data, target charge levels of a set of memory cells in the memory device for one or more programming steps; and
sending, to the memory device, indicators of the target charge levels of the set of memory cells for the one or more programming steps, each indicator comprising a number of binary values, the number of binary values being based on a number of page buffers per page in the memory device.

2. The system of claim 1, wherein determining the target charge levels for the set of the memory cells comprises identifying the target charge levels for the set of the memory cells from a predefined mapping between data values and charge levels.

3. The system of claim 1, wherein:
the operations further comprise detecting completion of a first programming step at the memory device, and
the sending of the indicators include sending one or more indicators to the memory device in response to detecting completion of the first programming step at the memory device.

4. The system of claim 1, wherein the one or more indicators include:
a first set of indicators that indicate the target charge levels for the set of memory cells for a first programming step; and
a second set of indicators that indicate the target charge levels for the set of memory cells for a second programming step.

5. The system of claim 4, wherein:
an indicator in the first set of indicators indicates whether a target charge level for a first memory cell is at least at a first charge level; and
an indicator in the second set of indicators indicates whether a target charge level for a second memory cell is at least at a second charge level.

6. The system of claim 4, wherein:
the one or more indicators further include a third set of indicators that indicate the target charge levels for the set of memory cells for a third programming step, and
an indicator in the third set of indicators indicates whether a target charge level for a third memory cell is at least at a third charge level.

7. The system of claim 1, wherein the sending of the indicators comprises writing a set of indicators to one or more page buffers of the memory device.

8. A method comprising:
receiving a command to program data to a memory device;
determining, based on the data, target charge levels of a set of memory cells in the memory device for one or more programming steps; and
sending, to the memory device, indicators of the target charge levels of the set of memory cells for the one or more programming steps, each indicator comprising a number of binary values, the number of binary values being based on a number of page buffers per page in the memory device.

9. The method of claim 8, wherein determining the target charge levels for the set of the memory cells comprises identifying the target charge levels for the set of the memory cells from a predefined mapping between data values and charge levels.

10. The method of claim 8, wherein:
the method further comprises detecting completion of a first programming step at the memory device, and
the sending of the indicators include sending one or more indicators to the memory device in response to detecting completion of the first programming step at the memory device.

11. The method of claim 8, wherein the one or more indicators include:
a first set of indicators that indicate the target charge levels for the set of memory cells for a first programming step; and
a second set of indicators that indicate the target charge levels for the set of memory cells for a second programming step.

12. The method of claim 11, wherein:
an indicator in the first set of indicators indicates whether a target charge level for a first memory cell is at least at a first charge level; and
an indicator in the second set of indicators indicates whether a target charge level for a second memory cell is at least at a second charge level.

13. The method of claim 11, wherein:
the one or more indicators further include a third set of indicators that indicate the target charge levels for the set of memory cells for a third programming step, and
an indicator in the third set of indicators indicates whether a target charge level for a third memory cell is at least at a third charge level.

14. A memory device comprising:
a set of memory cells; and
a processing device coupled to the set of memory cells, the processing device configured to perform operations comprising:
receiving, from a memory sub-system controller, indicators of target charge levels of the set of memory cells for one or more programming steps, each indicator comprising a number of binary values, the number of binary values being based on a number of page buffers per page in the memory device; and
performing the one or more programming steps according to the target charge levels indicated by the indicators.

15. The memory device of claim 14, wherein performing the one or more programming steps comprises moving charge levels of the set of memory cells to the target charge levels indicated by the indicators.

16. The memory device of claim 14, wherein the target charge levels for the one or more programming steps are based on a predefined mapping between data values and charge level.

17. The memory device of claim 14, wherein the indicators are determined based on data included in a command to write the data to the memory device received by the memory sub-system controller.

18. The memory device of claim 14, wherein:
a first indicator in the indicators indicates whether a target charge level for a first memory cell is at least at a first charge level; and
a second indicator in the indicators indicates whether a target charge level for a second memory cell is at least at a second charge level.

19. The memory device of claim 14, wherein the one or more indicators include:
- a first set of indicators that indicate the target charge levels for the set of memory cells for a first programming step; and
- a second set of indicators that indicate the target charge levels for the set of memory cells for a second programming step.

20. The memory device of claim 14, further comprising: one or more page buffers to receive the indicators.

\* \* \* \* \*